United States Patent
Park

(10) Patent No.: US 6,803,774 B2
(45) Date of Patent: Oct. 12, 2004

(54) MEMS VARACTOR FOR MEASURING RF POWER

(75) Inventor: Chul Hong Park, San Jose, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 68 days.

(21) Appl. No.: 10/253,383

(22) Filed: Sep. 23, 2002

(65) Prior Publication Data

US 2004/0056668 A1 Mar. 25, 2004

(51) Int. Cl.[7] .............................................. G01R 27/26
(52) U.S. Cl. ...................................... 324/661; 324/662
(58) Field of Search ................................ 324/658, 684, 324/660, 661, 662, 680; 73/800; 455/73, 425

(56) References Cited

U.S. PATENT DOCUMENTS 4,294,321 A  * 10/1981  Wittlinger et al. ..... 177/210 FP
6,670,864 B2 * 12/2003  Hyvonen et al. .............. 333/32
6,714,023 B2 *  3/2004  Mallory ....................... 324/662
6,724,324 B1 *  4/2004  Lambert ....................... 341/33

* cited by examiner

Primary Examiner—N. Lo
Assistant Examiner—Donald M. Lair

(57) ABSTRACT

A meter for measuring the root-mean-squared potential of an AC signal characterized by a frequency f is disclosed. The meter includes first and second capacitors. The AC signal is applied to the first capacitor, which includes first and second plates separated by a distance that depends on the root-mean-squared potential of the AC signal, but not on changes in the AC signal that occur over a time of 1/f. The second capacitor has first and second plates separated by a distance that depends on the separation of the first and second plates in the first capacitor. A detection circuit measures the capacitance of the second capacitor. The first plate of the first capacitor is preferably connected to the first plate of the second capacitor by a non-conducting mechanical link.

5 Claims, 3 Drawing Sheets

MEMS VARACTOR FOR MEASURING RF POWER

FIELD OF THE INVENTION

The present invention relates to AC circuits, and more particularly, to a device for measuring the power that is coupled to a load.

BACKGROUND OF THE INVENTION

To simplify the following discussion, the present invention will be discussed in reference to cellular telephones; however, it will become apparent from the following discussion that the present invention can be utilized in other applications. The power output by a cellular telephone is varied such that the signal received by the base station is more or less constant independent of the distance from the cellular telephone to the base station. When the cellular telephone is far from the base station, the output amplifier is set to generate the maximum allowed power. When the cellular telephone is close to the base station, the power level is reduced to a small fraction of the maximum allowed power. While the cellular power level can be controlled by a feedback loop relying on the signal received by the base station, such control is not always optimal. Accordingly, a device within the cellular telephone that can measure the actual power being output by a cellular telephone would provide advantages if the device did not draw a significant amount of power from the cellular telephone batteries.

SUMMARY OF THE INVENTION

The present invention is a meter for measuring the root-mean-squared potential of an AC signal characterized by a frequency f. The meter includes first and second capacitors. The AC signal is applied to the first capacitor, which includes first and second plates separated by a distance that depends on the root-mean-squared potential of the AC signal, but not on changes in the AC signal that occur over a time of the order of 1/f. The second capacitor has first and second plates separated by a distance that depends on the separation of the first and second plates in the first capacitor. A detection circuit measures the capacitance of the second capacitor. The first plate of the first capacitor is preferably connected to the first plate of the second capacitor by a non-conducting mechanical link. In the preferred embodiment of the present invention, the second electrode of the first capacitor includes a conducting layer on a substrate and the first plate of the first capacitor includes a conducting plate suspended over the first plate by a spring supported on the substrate.

DETAILED DESCRIPTION OF THE PREFERRED EMBODIMENTS OF THE INVENTION

Figure 1:
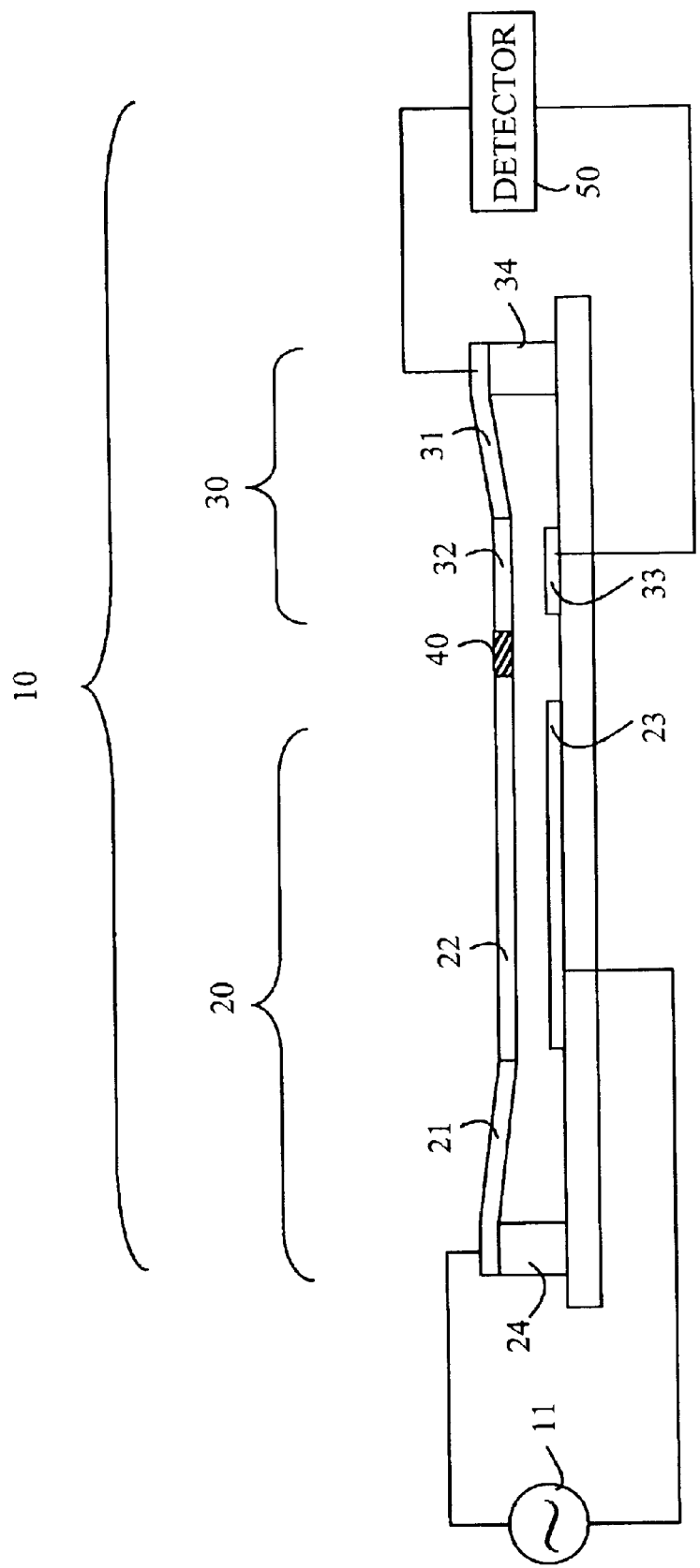
FIG. 1 is a cross-sectional view of power meter 10 through line 41–42 shown in FIG. 2.
Figure 2:
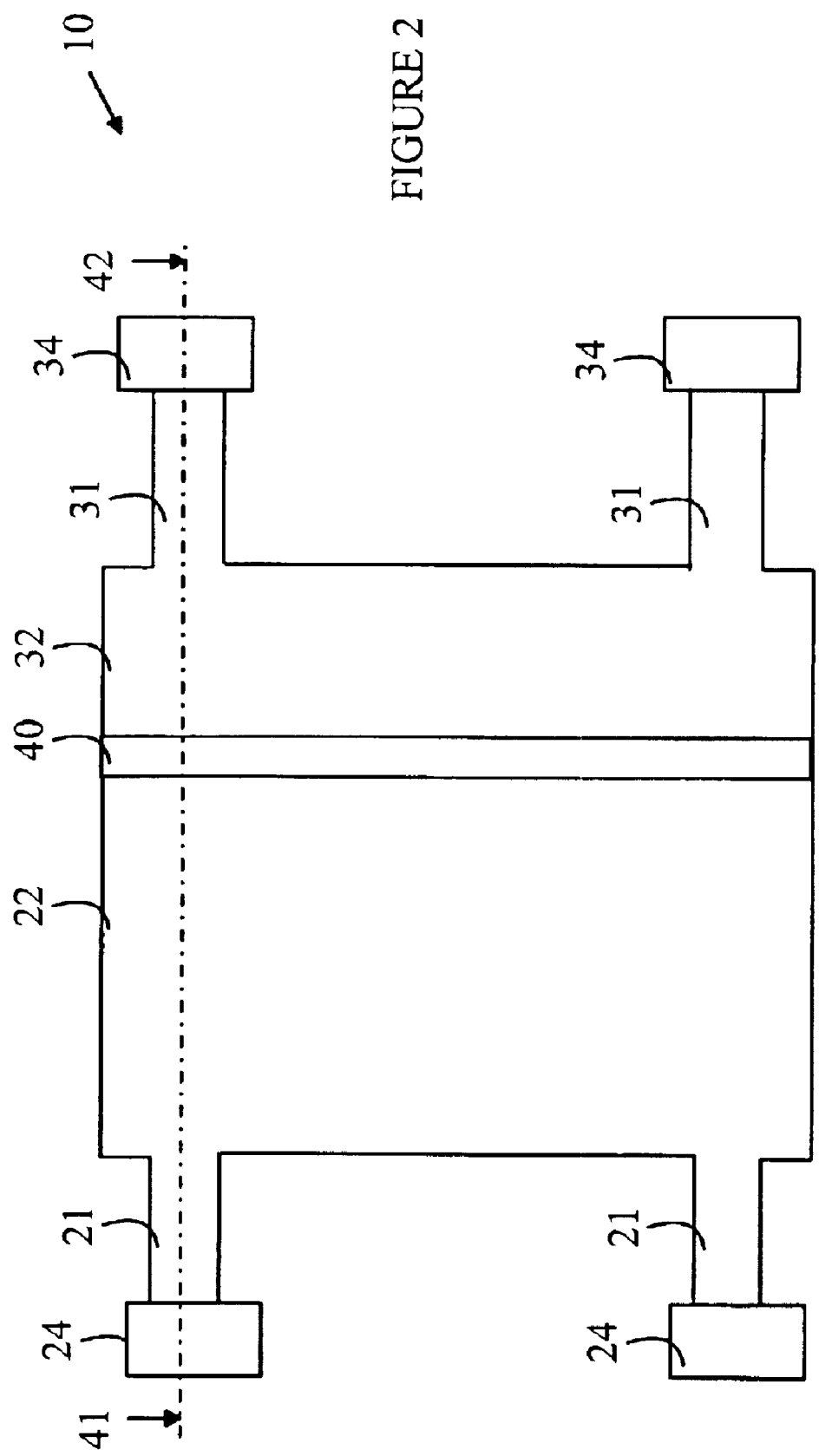
FIG. 2 is a top view of a power meter 10 according to the present invention connected to a source 11 whose power is to be measured.

The present invention is based on a micromachined (MEM) capacitor structure. The manner in which the present invention operates can be more easily understood with reference to FIGS. 1 and 2. FIG. 2 is a top view of a power meter 10 according to the present invention connected to a source 11 whose power is to be measured, and FIG. 1 is a cross-sectional view of power meter 10 through line 41–42. Power meter 10 can be viewed as having two MEM capacitors 20 and 30 connected by a mechanical link 40. Mechanical link 40 is assumed to be electrically insulating.

The first capacitor consists of plates 22 and 23. Plate 22 is suspended over plate 23 by a spring 21 that is connected to support 24. The signal whose power is to be measured is connected across capacitor 20.

The second capacitor consists of plates 32 and 33. Plate 32 is suspended over plate 33 by a spring 31 that is connected to support 34. The capacitance of capacitor 30 is sensed by detector 50 that measures the capacitance of capacitor 30.

Consider capacitor 20. When a signal is placed on plate 22 that creates a potential difference between plates 22 and 23, an attractive force is generated between the plates. If spring 21 is sufficiently flexible, plate 22 will move toward plate 23 in response to this force, and the distance between the plates will change. Since the top plate of capacitor 30 is linked to plate 22, the distance between plates 32 and 33 will also change in response to a change in the distance between plates 22 and 23. Hence, the capacitance of capacitor 30 is a measure of the separation between plates 22 and 23, which, in turn, is a measure of the potential applied between plates 22 and 23.

If the signal being measured changes polarity with a frequency that is much faster than the capacitor plates can move a significant distance, the plates will respond only to the average potential across the plates. RF signals change polarity much faster than the response time of a mechanical device. Hence, power meter 10 can be used to measure the root-mean-squared potential of a RF signal source. For the purposes of this discussion, a change in the plate separation of less than 1 percent of the separation will be considered to be an insignificant movement.

Methods for measuring the capacitance of a capacitor are well known in the electronic arts, and hence, will not be discussed in detail here. For example, the capacitor to be measured can be included in an LC tank circuit. The resonance frequency of the tank circuit changes when the capacitance changes. Hence, the impedance of the tank circuit will change drastically as a function of the frequency of an input signal at frequencies near the resonance. In another exemplary embodiment, detector 50 can generate and transmit an AC signal to the capacitor and measure the phase difference between the incident and reflected waves.

Figure 3:
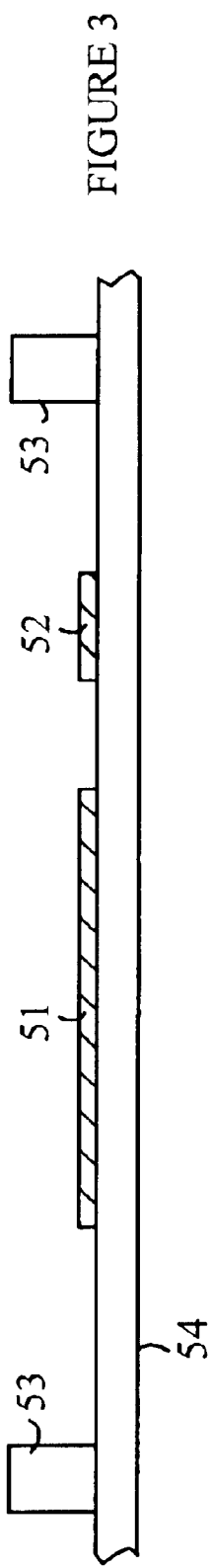
FIGS. 3, 4 and 5 are cross-sectional views of a power meter 50 at various stages in the fabrication process.
Figure 4:
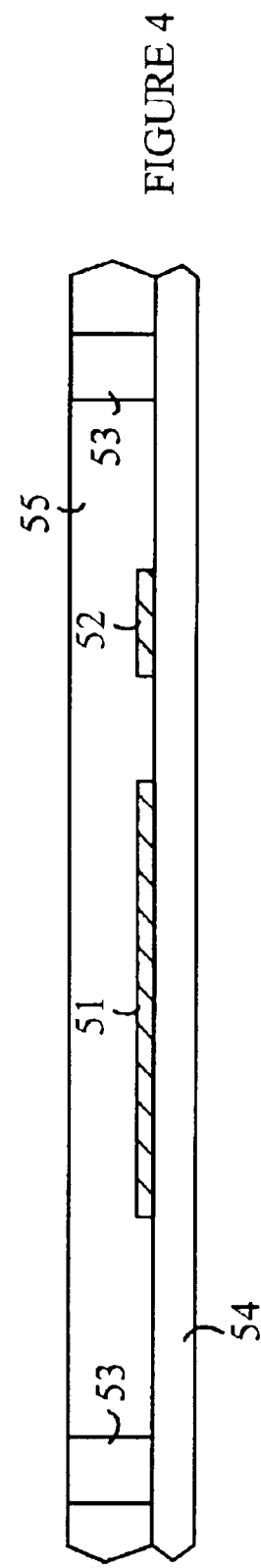
Figure 5:
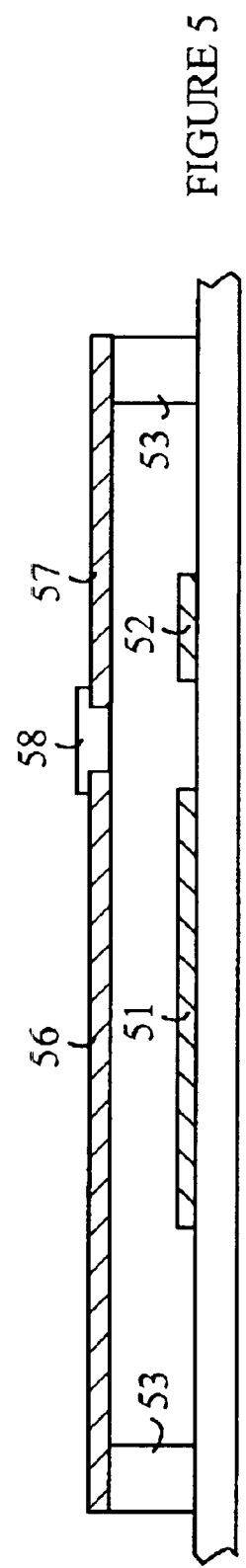

A power meter according to the present invention can be constructed in a manner analogous to the manner in which MEM capacitor structures are fabricated. An exemplary fabrication sequence is shown in FIGS. 3–5, which are cross-sectional views of a power meter 50 at various stages in the fabrication process. The bottom electrodes, shown at 51 and 52, and the supports for the top electrodes, shown at 53, are first deposited on substrate 54 using conventional lithographic techniques. The electrodes are preferably gold; however, other conductors that are capable of withstanding the remaining fabrication steps can be utilized.

The structure shown in FIG. 3 is then covered with a sacrificial layer 55 as shown in FIG. 4. Sacrificial layer 55 is then planarized back to the supports 53. Sacrificial layer 55 is preferably an easily etchable material such as PSG.

The top electrodes 56 and 57 and the springs are then deposited as a patterned layer on top of sacrificial layer 55 as shown in FIG. 5. The springs are preferably made from the same material as the top electrodes to simplify the fabrication process. The gap between electrodes 56 and 57 is filled with an insulating material to provide the non-conducting link shown at 58. Any non-conducting material that will adhere to the electrodes can be utilized. For example, if the electrodes are made of platinum, a non-conducting link can be formed by depositing a Ti layer over the gap and then oxidizing the Ti to form $TiO_2$.

Finally, the sacrificial layer is removed by a wet etch leaving the power meter as shown in FIG. 5. To provide access to the portion of sacrificial layer 55 that is under electrodes 56 and 57, electrodes 56 and 57 preferably include small holes. To simplify the drawings, these holes have been omitted from the figures.

Various modifications to the present invention will become apparent to those skilled in the art from the foregoing description and accompanying drawings. Accordingly, the present invention is to be limited solely by the scope of the following claims.

What is claimed is:

1. A meter for measuring an AC signal characterized by a frequency f, said meter comprising:

a first capacitor for receiving said AC signal, said first capacitor having first and second plates separated by a distance that depends on the root-mean-squared potential of said AC signal, but not on changes in said AC signal that occur over a time of 1/f;

a second capacitor having first and second plates separated by a distance that depends on the separation of said first and second plates in said first capacitor; and a circuit for measuring the capacitance of said second capacitor.

2. The meter of claim 1 wherein said second electrode of said first capacitor comprises a conducting layer on a substrate and wherein said first plate of said first capacitor comprises a conducting plate suspended over said first plate by a spring supported on said substrate.

3. A meter for measuring an AC signal characterized by a frequency f, said meter comprising:

a first capacitor for receiving said AC signal, said first capacitor having first and second plates separated by a distance that depends on the root-mean-squared potential of said AC signal, but not on changes in said AC signal that occur over a time of 1/f;

a second capacitor having first and second plates separated by a distance that depends on the separation of said first and second plates in said first capacitor; and a circuit for measuring the capacitance of said second capacitor, wherein said first plate of said first capacitor is connected to said first plate of said second capacitor by a non-conducting mechanical link.

4. A method for measuring the root-mean-squared potential of an AC signal characterized by a frequency f, said method comprising:

applying said AC signal across the plates of a first capacitor, said first capacitor having first and second plates separated by a distance that depends on the root-mean-squared potential of said AC signal, but not on changes in said AC signal that occur over a time of 1/f;

providing a second capacitor having first and second plates separated by a distance that depends on the separation of said first and second plates in said first capacitor; and measuring the capacitance of said second capacitor.

5. A method for measuring the root-mean-squared potential of an AC signal characterized by a frequency f, said method applying said AC signal across the plates of a first capacitor, said first capacitor having first and second plates separated by a distance that depends on the root-mean-squared potential of said-AC signal, but not on changes in said AC signal that occur over a time of 1/f;

providing a second capacitor having first and second plates separated by a distance that depends on the separation of said first and second plates in said first capacitor; and measuring the capacitance of said second capacitor, wherein said first plate of said first capacitor is connected to said first plate of said second capacitor by a non-conducting mechanical link.

* * * * *